(12) United States Patent
Kim

(10) Patent No.: US 7,344,974 B2  
(45) Date of Patent: Mar. 18, 2008

(54) METALLIZATION METHOD OF SEMICONDUCTOR DEVICE

(75) Inventor: Jung Joo Kim, Seoul (KR)

(73) Assignee: Dongbu Electronics Co., Ltd., Seoul (KR)

(*) Notice: Subject to any disclaimer, the term of this patent is extended or adjusted under 35 U.S.C. 154(b) by 62 days.

(21) Appl. No.: 11/320,304

(22) Filed: Dec. 29, 2005

(65) Prior Publication Data

US 2006/0148242 A1   Jul. 6, 2006

(30) Foreign Application Priority Data

Dec. 31, 2004   (KR) .................. 10-2004-0117665

(51) Int. Cl.
   *H01L 21/283* (2006.01)
(52) U.S. Cl. ............. 438/629; 438/637; 438/639; 438/648; 438/675; 438/680; 438/700; 438/702; 438/703
(58) Field of Classification Search ......... 438/629, 438/637, 639, 648, 653, 656, 675, 680, 682, 438/700, 702, 703, FOR. 388, FOR. 405
See application file for complete search history.

(56) References Cited

U.S. PATENT DOCUMENTS

| | | | | |
|---|---|---|---|---|
| 5,972,179 A | * | 10/1999 | Chittipeddi et al. | ... 204/192.17 |
| 6,022,800 A | * | 2/2000 | Ho et al. | ..... 438/643 |
| 6,146,996 A | * | 11/2000 | Sengupta | ..... 438/639 |
| 6,737,356 B1 | * | 5/2004 | Dow | ..... 438/696 |
| 6,787,468 B2 | * | 9/2004 | Kim et al. | ..... 438/688 |
| 2002/0192948 A1 | * | 12/2002 | Chen et al. | ..... 438/643 |
| 2003/0064578 A1 | * | 4/2003 | Nakamura et al. | ..... 438/627 |
| 2005/0023702 A1 | * | 2/2005 | Nishimura et al. | ..... 257/774 |

* cited by examiner

*Primary Examiner*—George R. Fourson  
*Assistant Examiner*—Joannie Adelle Garcia  
(74) *Attorney, Agent, or Firm*—Finnegan, Henderson, Farabow, Garrett, & Dunner, L.L.P.

(57) ABSTRACT

A method for forming a metallization contact in a semiconductor device includes the steps of: (a) forming an insulating layer on a semiconductor substrate including an active device region; (b) forming a contact hole to expose a portion of the active device region by etching a portion of the insulating layer; (c) forming a CVD TiN layer on the insulating layer and inside the contact hole; (d) forming a PVD TiN layer on the CVD TiN layer using ionized metal plasma sputtering; and (e) forming a metal layer on the PVD TiN layer.

4 Claims, 2 Drawing Sheets

METALLIZATION METHOD OF SEMICONDUCTOR DEVICE

This application claims the benefit of priority of Korean Application No. 10-2004-0117665, filed on Dec. 31, 2004, which is incorporated by reference herein in its entirety.

BACKGROUND OF THE INVENTION

1. Technical Field

The present invention relates generally to semiconductor device manufacturing technology, and particularly to a method for forming a metallization contact in a semiconductor device.

2. Description of the Related Art

Thin film aluminum and aluminum alloys are fundamental materials having application in the semiconductor integrated circuits industry. Aluminum is a good conductor, and adheres well to silicon and silicon dioxide. A significant problem in using aluminum for interconnects is junction spiking, which occurs at the interface of pure aluminum and silicon and worsens when the interface is heated during commonly performed heat treatments, such as annealing, due to the change of the solubility of silicon aluminum with temperature. Junction spiking results in current leakage when the aluminum is a contact to a p-n junction. If aluminum penetrates beyond the p-n junction depth below the contact, the junction will be electrically shorted.

One technique to address to this challenge is to use a barrier metal structure, i.e., titanium/titanium nitride (Ti/TiN) double layer structure, as underlying layers for aluminum or aluminum alloy metallization contacts on silicon-based devices, in order to prevent the interdiffusion of aluminum and silicon, and obtain a good ohmic contact at the interface thereof.

FIG. 1 shows a conventional method for forming a metallization contact. An insulating layer is formed on a semiconductor substrate 1 and etched to form a contact hole (not numbered) exposing an active region 2 of substrate 1. Reference numeral 2' denotes a remaining portion of the insulating layer. A titanium (Ti) layer 3 is then deposited to cover insulating layer 2' and active region 2 and a titanium nitride (TiN) layer 5 is deposited on Ti layer 3 in an nitrogen (N) atmosphere. An aluminum layer 6 is deposited on TiN layer 5 to form a metal wiring. Because titanium reacts with silicon in active region 2 to form titanium silicide (TiSi$_x$, particularly TiSi$_2$), a diffusion barrier having a structure of TiSi$_2$/Ti/TiN is formed.

In the conventional aluminum metallization with the aforementioned diffusion barrier structure, the Ti and TiN layer are deposited by physical vapor deposition (PVD) sputtering method. However, PVD sputtering generally has inferior step coverage ability and cannot provide adequate film thickness along the sidewalls of the contact hole. In particular, when an aspect ratio (i.e., the ratio of height-to-diameter) of the contact hole rises up to be about 1, according to the higher integration of the devices, the step coverage of Ti/TiN decreases to be less than about 40%. Owing to the inferior step coverage, the electric resistivity of the metal wire increases during the operation of the device, resulting in decrease of the operational speed of the device, and over time a short circuit conduction between the active region of the substrate and the metal wire in a long run. In addition, the inferior step coverage of PVD may disturb the subsequent deposition of aluminum or aluminum alloys in the contact hole. Specifically, Ti/TiN deposited in the contact hole by PVD may have a negative slope, as shown in FIG. 1. As a result, subsequently deposited aluminum cannot provide sufficient coverage in the contact.

As an alternative to aluminum contacts, tungsten (W) has been used to form contacts, often referred to as "tungsten plugs." FIG. 2 shows a tungsten plug formed in a contact hole (not numbered). A TiN layer 12 is used as the barrier for the tungsten plug. In contrast with the above explained aluminum metallization, TiN barrier 12 is formed by a chemical vapor deposition (CVD) using TDMAT (Tetrakis Dimethylamino Titanium) as a source. Thus, the tungsten plug formation process does not incur spiking. Although the CVD TiN process has superior step coverage ability, certain precursor chemicals, however, are required to initiate the formation of the TiN. Such precursor chemicals introduce a large quantity of impurities, e.g., carbon, into TiN layer 12. Carbon may diffuse into a silicon substrate 10, thus increasing the electric resistivity of the contacts.

Most impurities can be removed by plasma treatment, but plasma ions cannot reach the lower part of the sidewalls of the contact hole. The impurities in the lower part of TiN layer 12 on the sidewalls may result in the degradation of step coverage of the subsequent tungsten deposition process. FIG. 2 shows a void in the tungsten plug formed in the contact hole due to the nonuniformity in TiN layer 12. As a result, contact resistance increases and device reliability decreases.

SUMMARY OF THE INVENTION

The present invention provides a method for forming a metallization contact in a semiconductor device, wherein the metallization contact has a bilayer TiN structure for improving step coverage in metal deposition.

A method for forming a metallization contact in a semiconductor device, consistent with an embodiment of the present invention, includes the steps of: (a) forming an insulating layer on a semiconductor substrate including an active device region; (b) forming a contact hole to expose a portion of the active device region by etching a portion of the insulating layer; (c) forming a CVD TiN layer on the insulating layer and inside the contact hole; (d) forming a PVD TiN layer on the CVD TiN layer using ionized metal plasma sputtering; and (e) forming a metal layer on the PVD TiN layer.

The bilayer TiN structure consists of a chemical vapor deposited TiN layer and a physical vapor deposited TiN layer. The CVD TiN layer preferably has a thickness of 40~50 Å on a sidewall of the contact hole.

These and other aspects of the invention will become evident by reference to the following description of the invention, often referring to the accompanying drawings.

BRIEF DESCRIPTION OF DRAWINGS

The accompanying drawings, which are incorporated in and constitute a part of this specification, illustrate embodiments of the invention and, together with the description, serve to explain the features, advantages, and principles of the invention.

In the drawings.

DETAILED DESCRIPTION OF THE INVENTION

Reference will now be made in detail to the present embodiments of the invention, examples of which are illustrated in the accompanying drawings. Wherever possible, the same reference numbers will be used throughout the drawings to refer to the same or like parts.

Figure 1:
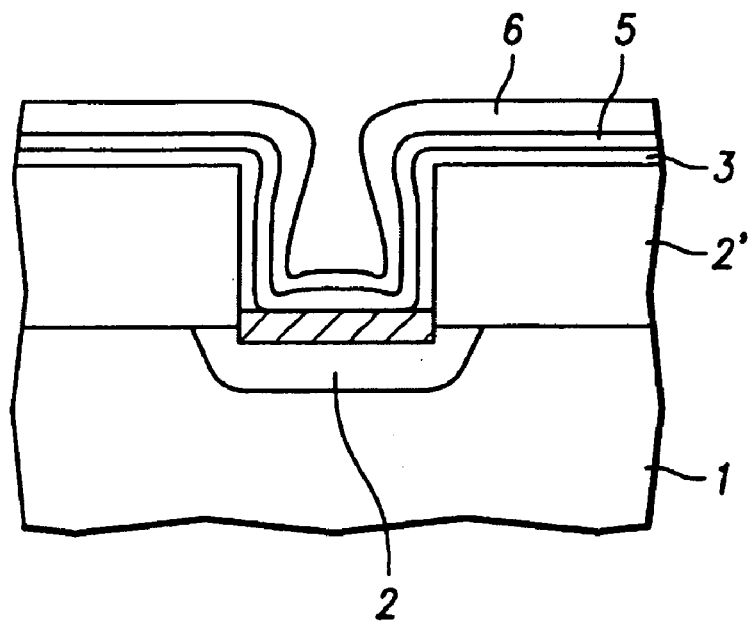
FIG. 1 is a cross-sectional view of a metallization contact structure, illustrating a conventional method of forming aluminum metallization contacts using PVD sputtering.
Figure 2:
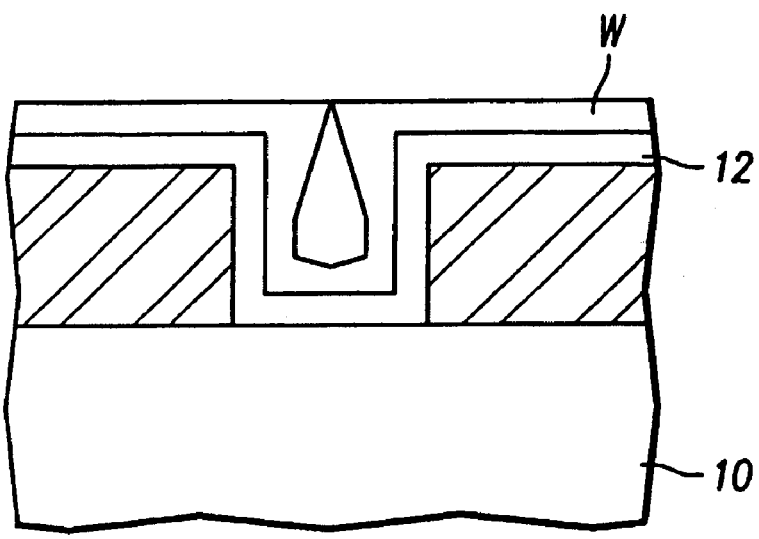
FIG. 2 is a cross-sectional view of a metallization contact structure, illustrating a conventional method of forming tungsten metallization contacts using CVD sputtering.
Figure 3:
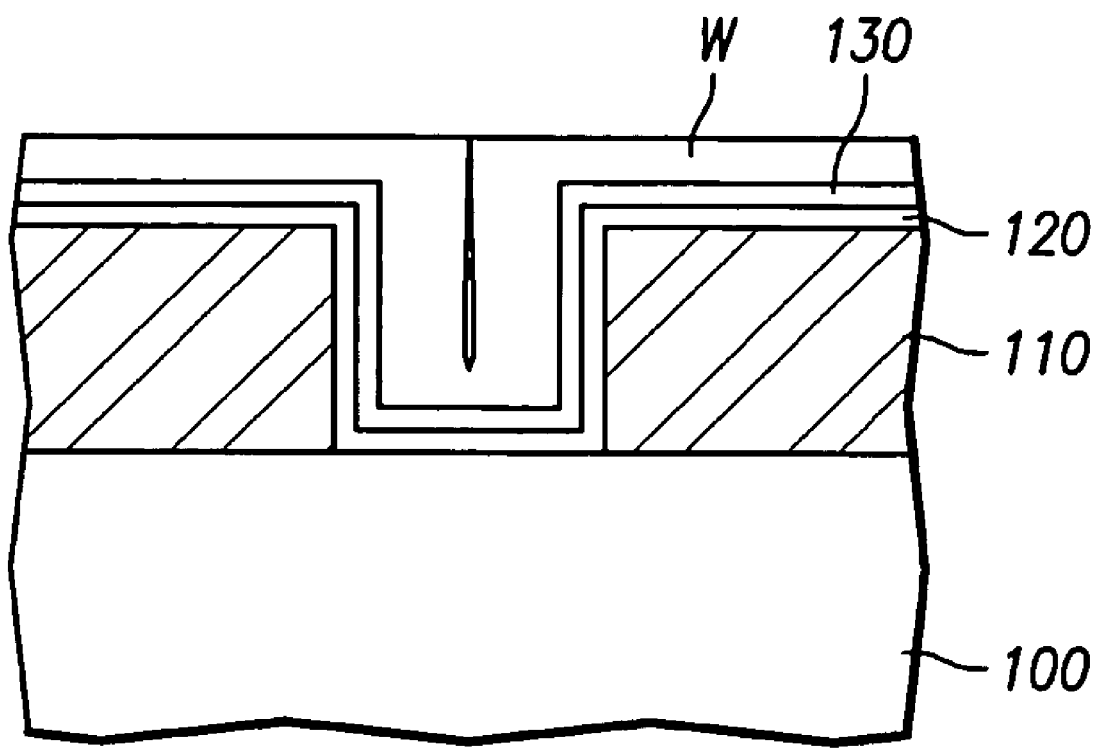
FIG. 3 is a cross-sectional view of a metallization contact structure, illustrating a method for forming a metallization contact in a semiconductor device consistent with an embodiment of the present invention.

FIG. 3 illustrates an exemplary contact structure utilizing a bilayer TiN barrier structure with a tungsten contact layer. The bilayer TiN structure comprises one TiN layer deposited by a chemical vapor deposition (CVD) process and one TiN layer deposited by a physical vapor deposition (PVD) process. The CVD TiN layer may be formed to have a minimum thickness and may have an amorphous or non-crystalline structure.

Referring to FIG. 3, a contact hole (or via hole, not numbered) is formed by etching a predetermined portion of an insulating layer 110 formed on a silicon substrate 100. The contact hole exposes a portion of an active region of substrate 100. A TiN layer 120 is then formed by CVD, to a thickness of about 40~50 Å, over the entire surface of substrate 100. The TiN deposited on the sidewall of the contact hole may have a thickness of about 80~150 Å.

Then, a second TiN layer 130 is formed on TiN layer 120 by a PVD process using ionized metal plasma (IMP). The IMP sputtering provides good contact bottom coverage for devices having small features sized less than 0.25 μm. However, the IMP sputtering provides insufficient sidewall coverage, and a thickness of the TiN deposited on the sidewall during the deposition of TiN layer 130 has a thickness of about 10~20 Å, when a thickness of TiN layer 130 is about 100 Å in other regions. In 0.18 L technology having a critical dimension of 0.22 μm and height of 7500 Å, TiN layer 130 is formed in a thickness of less than about 300 Å.

Finally, a metal layer such as tungsten (W) is deposited over the entire surface of the substrate and in the contact hole to form a metal wire. The bilayer TiN structure including CVD TiN layer 120 and PVD TiN layer 130 provides an appropriate thickness of TiN on the sidewalls of the contact hole, which may facilitate the deposition of the metal with a good step coverage and satisfactory gap filling characteristics. PVD TiN layer 130 also serves as a passivation layer to the metal wire. CVD TiN layer 120 may efficiently suppress any impurity diffusion.

While the invention has been shown and described with reference to certain embodiments thereof, it will be understood by those skilled in the art that various changes in form and details may be made therein without departing from the spirit and scope of the invention as defined by the appended claims.

What is claimed is:

1. A method for forming a metallization contact in a semiconductor device, comprising the steps of:
    (a) forming an insulating layer over a semiconductor substrate including an active device region;
    (b) forming a contact hole to expose a portion of the active device region by etching a portion of the insulating layer;
    (c) forming a CVD TiN layer directly on the insulating layer and inside the contact hole;
    (d) forming a PVD TiN layer on the CVD TiN layer using ionized metal plasma sputtering; and
    (e) forming a metal layer on the PVD TiN layer.

2. The method of claim 1, wherein forming the CVD TiN layer comprises forming the CVD TiN layer to have a thickness of 40~50 Å on a sidewall of the contact hole.

3. The method of claim 1, wherein forming the metal layer comprises forming the metal layer from tungsten.

4. The method of claim 1, wherein forming the PVD TiN layer comprises forming the PVD TiN layer to have a thickness of 10~20 Å on a side wall of the contact hole.

* * * * *